United States Patent [19]
Angerstein et al.

[11] Patent Number: 5,350,943
[45] Date of Patent: Sep. 27, 1994

[54] SEMICONDUCTOR ASSEMBLY, IN PARTICULAR A REMOTE CONTROL RECEPTION MODULE

[75] Inventors: Jörg Angerstein, Flein; Siegfried Giebler, Wüstenrot-Neuhütten; Thomas Mistele, Ilsfeld; Werner Schairer, Weinsberg; Helmut Scheidle, Neuenstadt, all of Fed. Rep. of Germany

[73] Assignee: Temic Telefunken microelectronic GmbH, Heilbronn, Fed. Rep. of Germany

[21] Appl. No.: 35,168

[22] Filed: Mar. 22, 1993

[30] Foreign Application Priority Data

Apr. 18, 1992 [DE] Fed. Rep. of Germany ....... 4212948

[51] Int. Cl.⁵ .................... H01L 25/04; H01L 23/34
[52] U.S. Cl. .................... 257/659; 257/676; 257/691
[58] Field of Search ............... 257/659, 660, 691, 666, 257/693, 676, 704

[56] References Cited

U.S. PATENT DOCUMENTS

| | | | |
|---|---|---|---|
| 3,585,455 | 6/1971 | Naylor | 257/659 |
| 4,177,480 | 12/1979 | Hintzmann et al. | |

FOREIGN PATENT DOCUMENTS

| | | |
|---|---|---|
| 2931594 | 2/1980 | Fed. Rep. of Germany . |
| 3112235 | 10/1982 | Fed. Rep. of Germany . |
| 3617229 | 11/1987 | Fed. Rep. of Germany . |
| 3633190 | 4/1988 | Fed. Rep. of Germany . |
| 8808815 | 10/1988 | Fed. Rep. of Germany . |
| 3742763 | 6/1989 | Fed. Rep. of Germany . |
| 3837301 | 5/1990 | Fed. Rep. of Germany . |
| 3904219 | 8/1990 | Fed. Rep. of Germany . |
| 59-72748 | 4/1984 | Japan .................. 257/659 |
| 61-252652 | 11/1986 | Japan .................. 257/659 |
| 141253 | 2/1989 | Japan . |
| 1-278052 | 11/1989 | Japan .................. 257/659 |
| 2140205 | 11/1984 | United Kingdom . |

Primary Examiner—Rolf Hille
Assistant Examiner—S. V. Clark
Attorney, Agent, or Firm—Spencer, Frank & Schneider

[57] ABSTRACT

A semiconductor assembly with a metal frame configuration is described, having a semiconductor component (HL) on a carrier section (T) of a ground strip section (M). The ground strip segment has an extension section (V) with which it is extended beyond said carrier section and is both folded over in relation to said carrier section and of sufficient length that it covers said semiconductor component in order to shield it electromagnetically.

In this assembly, the ground strip section has a multiple function. It is used not only for carrying and contacting of electrical components, but also acts at the same time as electromagnetic shielding for a semiconductor component, for example for the radiation detector of a remote control reception module. This shielding is dependably connected to ground since it is formed as one piece with the ground line, it is simple to manufacture since no special connecting operations are necessary, and it is space-saving since no space is required for stable connection points between the shielding and other parts of the assembly.

17 Claims, 3 Drawing Sheets

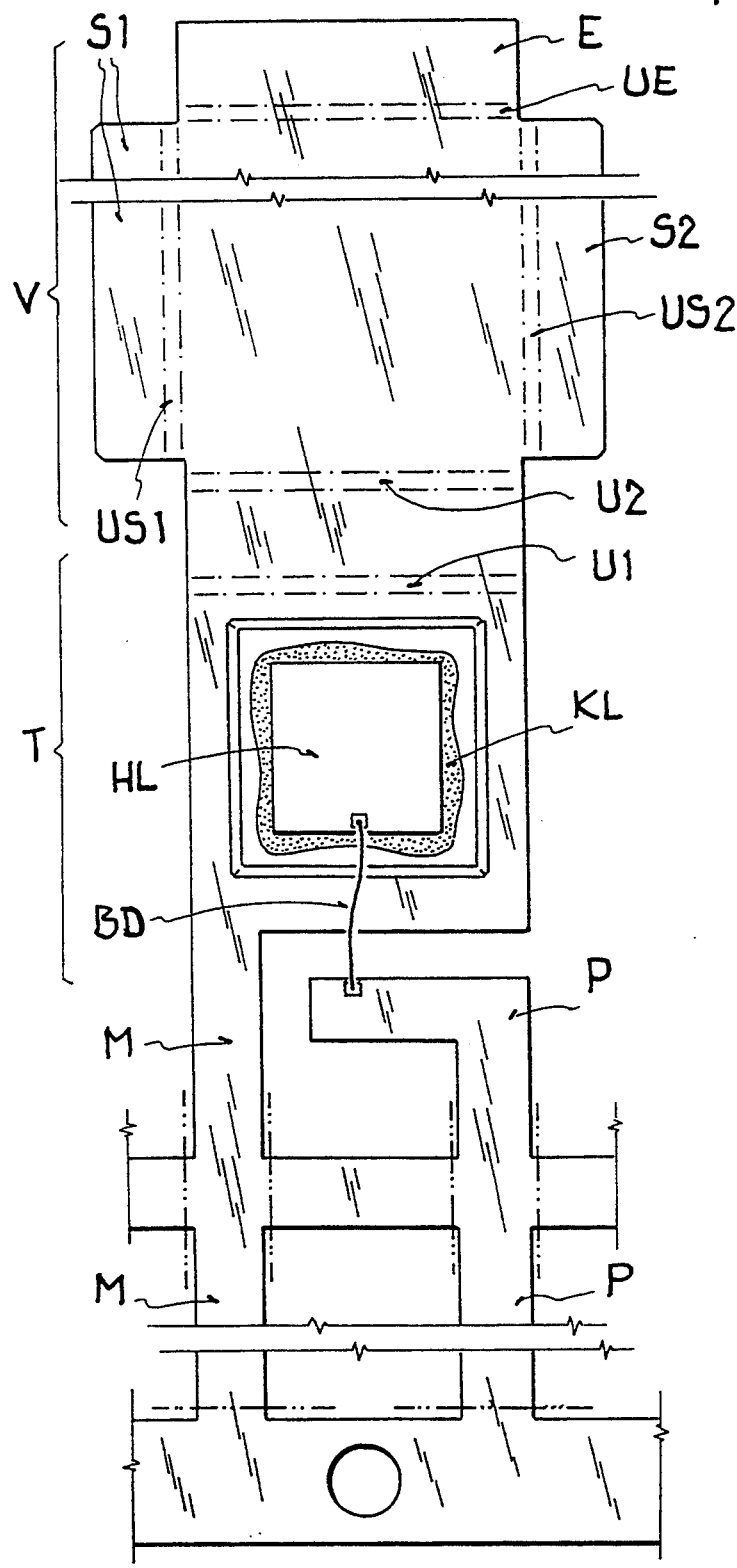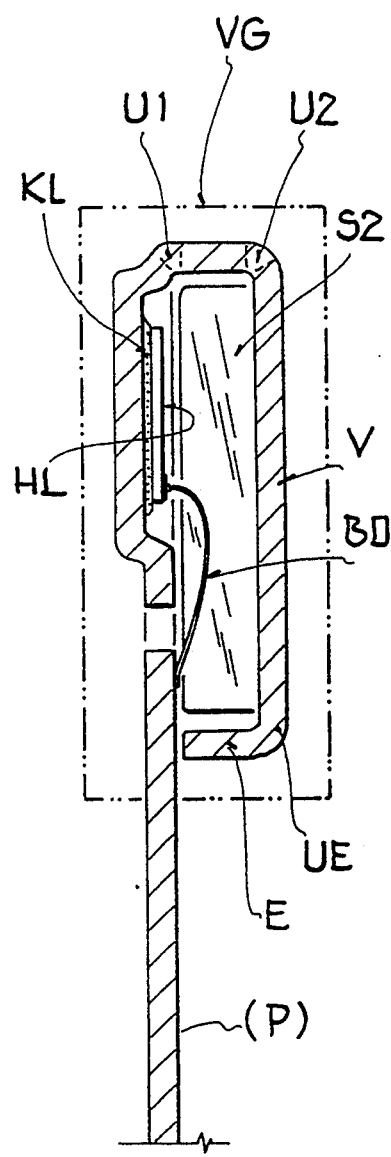

SEMICONDUCTOR ASSEMBLY, IN PARTICULAR A REMOTE CONTROL RECEPTION MODULE

BACKGROUND OF THE INVENTION

The invention relates to a semiconductor assembly, in particular to a remote control reception module.

The main components of a semiconductor assembly are a carrier and semiconductor components mounted on this carrier, and in addition a housing that can be designed in the form of a casting.

In semiconductor assemblies with components having a greater overall volume, the carrier is generally a Printed Circuit board (PCB) usually comprising an insulator provided with conducting paths. By contrast, semiconductor assemblies with components having a lower overall volume typically have a metal frame configuration, in which at least one semiconductor component is attached to conducting strips, which include a ground strip segment. The housing in the case of the strip configuration generally takes the form of a casting. A semiconductor assembly with metal frame configuration therefore has the following components:

a ground strip segment for connection to ground, as one of at least two strip segments;

at least one semiconductor component attached to the upper part of the ground strip segment on a carrier section of the ground strip segment; and a casting enclosing the upper part of the strip segments.

In many semiconductor assemblies, it is necessary to shield at least one of the semiconductor components they contain against electromagnetic interference radiation. This applies in particular for all types of detectors for electromagnetic radiation Semiconductor assemblies with shielding typically have the aforementioned design with a carrier PCB to which the shielding can easily be attached. The shielding comprises, for example, a housing of an electrically conductive plastic, of sheet metal or of a wire grid.

Optical shielding is also necessary. Remote control reception modules, as used in TV sets for example, receive modulated IR radiation emitted by semiconductor diodes, in a wavelength range in which interference radiation sources, for example light bulbs, fluorescent lights or energy-saving bulbs, also emit infrared radiation. A silicon (Si) pin diode that absorbs the radiation up to about 1100 nm is typically used as a detector in the reception module. The interference radiation is filtered out towards the short-wave side by a cutoff filter whose absorption edge is around 800 nm, for example. The absorption edge of the filter can easily be set by selection of suitable coloring. The colorant is generally mixed into the casting material. The filter must be at least in the area between an opening in the electromagnetic shielding and the detector surface. To prevent electromagnetic interference radiation entering this opening in the shielding, various measures are taken. One of these is to seal the opening with an electrically conducting foil that is permeable to the radiation to be received. Another measure is to provide a perforated metal plate or wire grid in the opening. A third measure is to provide the detector with a front contact connected to ground.

The known semiconductor assemblies having at least one semiconductor component to be shielded against electromagnetic radiation require a large amount of space on account of the shielding which must be specially fitted, and are expensive to manufacture. They also require a dependably acting electrical connection between the shielding and a ground connection.

The problem was therefore to provide a semiconductor assembly having at least one semiconductor component to be shielded against electromagnetic radiation, that can be compactly built manufactured inexpensively and that ensures a dependable ground connection of the shielding.

SUMMARY OF THE INVENTION

The semiconductor assembly in accordance with the invention is one with a strip configuration as described at the outset. This assembly is characterized in that the ground strip segment has an extension section with which it is extended beyond the carrier section and is both folded over in relation to this carrier section and of sufficient length that it covers the semiconductor component in order to shield it electromagnetically.

Unlike semiconductor assemblies typically used before and with electromagnetically shielded semiconductor component, the assembly in accordance with the invention is not one of the PCB type, but of the strip type, which however does not represent in itself a major advantage, since it makes no great difference as regards fitting expenditure whether a PCB configuration or a strip configuration is connected to an electromagnetically shielding housing. The semiconductor assembly in accordance with the invention affords substantial advantages in that the ground strip segment is designed such that not only is it used for carrying at least one semiconductor component and for manufacturing of at least one ground contact, but it also has the function of electromagnetic shielding at the same time. This shielding is obviously dependably connected to ground, as it is itself part of the earth contact. This shielding is also easy to fit, since no mechanical steps whatsoever are necessary for connection to other components, but only the ground strip segment has to be folded over such that it covers at least one semiconductor component attached in its carrier section. The fact that no special mechanical connections have to be made, which generally entail stable connection points, means that the space requirement is very low. The shielding housing with its low dimensions provided by the folded-over sections of the ground strip segment is initially very unstable, but is maintained in stable and damage-proof shape by the casting.

If the electromagnetically shielded semiconductor component is a radiation detector, the folded-over extension section must have a cutout through which the radiation to be detected can penetrate. To ensure nevertheless the best possible shielding from electromagnetic radiation, this opening can, for example, be punched out of the ground strip segment such that bars remain in the form of a grid, or a completely punched out opening can be covered with an electrically conducting transparent foil known per se. It is of particular advantage to use a detector with a contact on the front and to connect this contact to the ground strip segment. Furthermore, it considerably improves the quality of the shielding when the semiconductor component is inserted into a recess in the carrier section.

If the invention is applied to a remote control reception module, the result is a reduction of the space requirement to about one-fifth of that needed for the smallest configurations possible previously, in which the carrier and the shielding are not designed in a single piece as a strip segment, but enter the production process as separate parts, and are not connected mechanically and electrically until during the manufacturing process.

BRIEF DESCRIPTION OF THE DRAWINGS

FIG. 1: Plan view of a strip configuration according to an embodiment of the invention, shown in simplified form and having a ground strip segment with several sections all in one level;

FIG. 2: Longitudinal section through the strip configuration as per FIG. 1, however with different sections of the ground strip segment being folded over in order to provide electromagnetic shielding for a semiconductor component;

DESCRIPTION OF THE PREFERRED EMBODIMENT

Figure 3:
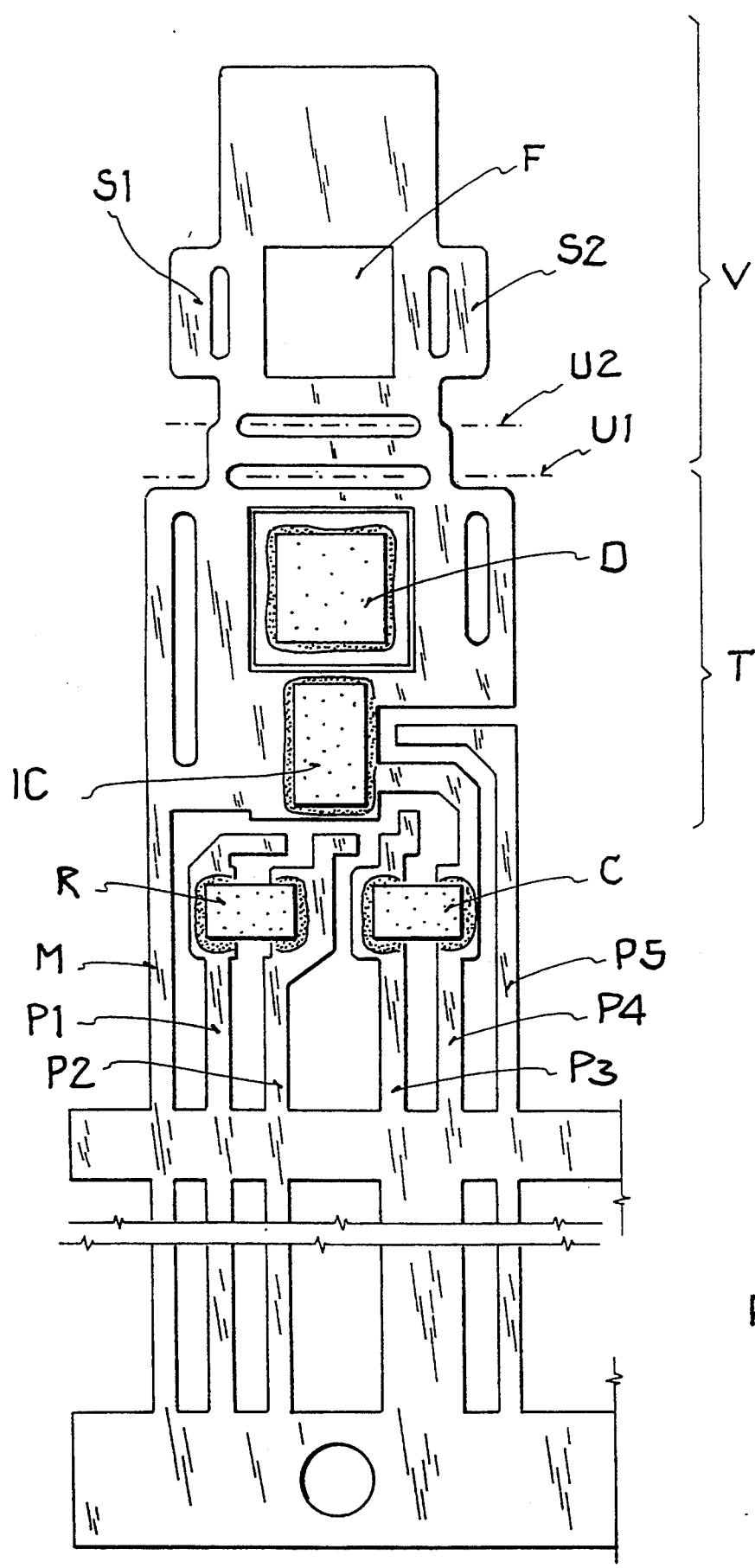
FIG. 3: Plan view corresponding to that in FIG. 1, however for a concrete example of a strip configuration for a remote control reception module.

FIGS. 1 and 2 show clearly a semiconductor assembly with strip configuration in its simplest form according to an embodiment of the invention. FIG. 1 shows here a state prevailing during manufacture, while FIG. 2 is a sectional view of the finished assembly.

Strip arrays are available in semiconductor technology that are wound off a reel. FIG. 1 shows only a single array with a ground strip segment M, and with a strip segment P via which a potential can be supplied that differs from the ground potential. The ground strip segment has a carrier section T and an extension section V. In the embodiment in FIGS. 1 and 2, a semiconductor component HL is affixed using an electrically conducting adhesive to the carrier section, as a result of which the rear face of the semiconductor component HL is connectable to ground. A contact path on the front of the semiconductor component HL is connected by a bond wire BD to the second strip segment P. The semiconductor component HL is any component, with the exception of detector components, that must be shielded against electromagnetic radiation. Detector components are excluded in the embodiment in FIGS. 1 and 2, since the extension section V does not have a window through which radiation to be detected could enter. If a window of this type is present, particular problems occur that are discussed below on the basis of FIGS. 3 and 4.

The extension section V is connected to the carrier section T by two fold-over seams U1 and U2 spaced slightly apart. Along the lines of these fold-over seams the ground strip segment is slightly weakened by stamping, so that the extension section V can be easily folded over such that it covers the semiconductor component HL, as can be easily seen in the sectional diagram in FIG. 2. At the end of the extension section V facing away from the carrier section T, an end section E is provided that is connected to the extension section by a fold-over seam UE. Finally, lateral sections S1 and S2 are provided on both sides of the extension section and are connected to the extension section by a fold-over seam US1 and US2 respectively. When these sections have all been folded over the semiconductor component is completely surrounded by them, such that it is located inside the electromagnetically shielding housing that is connectable to ground. In the embodiments as shown in all the Figs., the carrier section T has a further recess in which the semiconductor component HL is seated, which helps to improve the shielding, particularly as is the case in the embodiment according to FIGS. 3 and 4, when there is a window in the extension section V, and the highly conducting front side of the semiconductor component HL is connected to the ground strip segment.

The semiconductor assembly as per FIG. 2 is manufactured as follows: first a layer of the adhesive KL is placed in the recess provided in the carrier section T. The semiconductor component HL is fitted on this adhesive layer, whereupon the bond wire BD is connected to the semiconductor component and to the second strip segment P. The two lateral sections S1 and S2 and the end section E are now folded up, whereupon the extension section V is folded over such that it is parallel to the carrier section T, as shown in FIG. 2. A plurality of strip configurations thus treated is then separated from the belt with the strip arrays, and the several strip arrays still joined together are immersed individually in a mold with a casting compound, thereby forming a casting VG as indicated by the dashed line in FIG. 2. Alternatively, the plastic housing can be made by a molding process as commonly used in the semiconductor industry. The semiconductor assemblies thus formed are then separated from one another along the lines indicated by the dash-dotted lines in FIG. 1.

Figure 4:
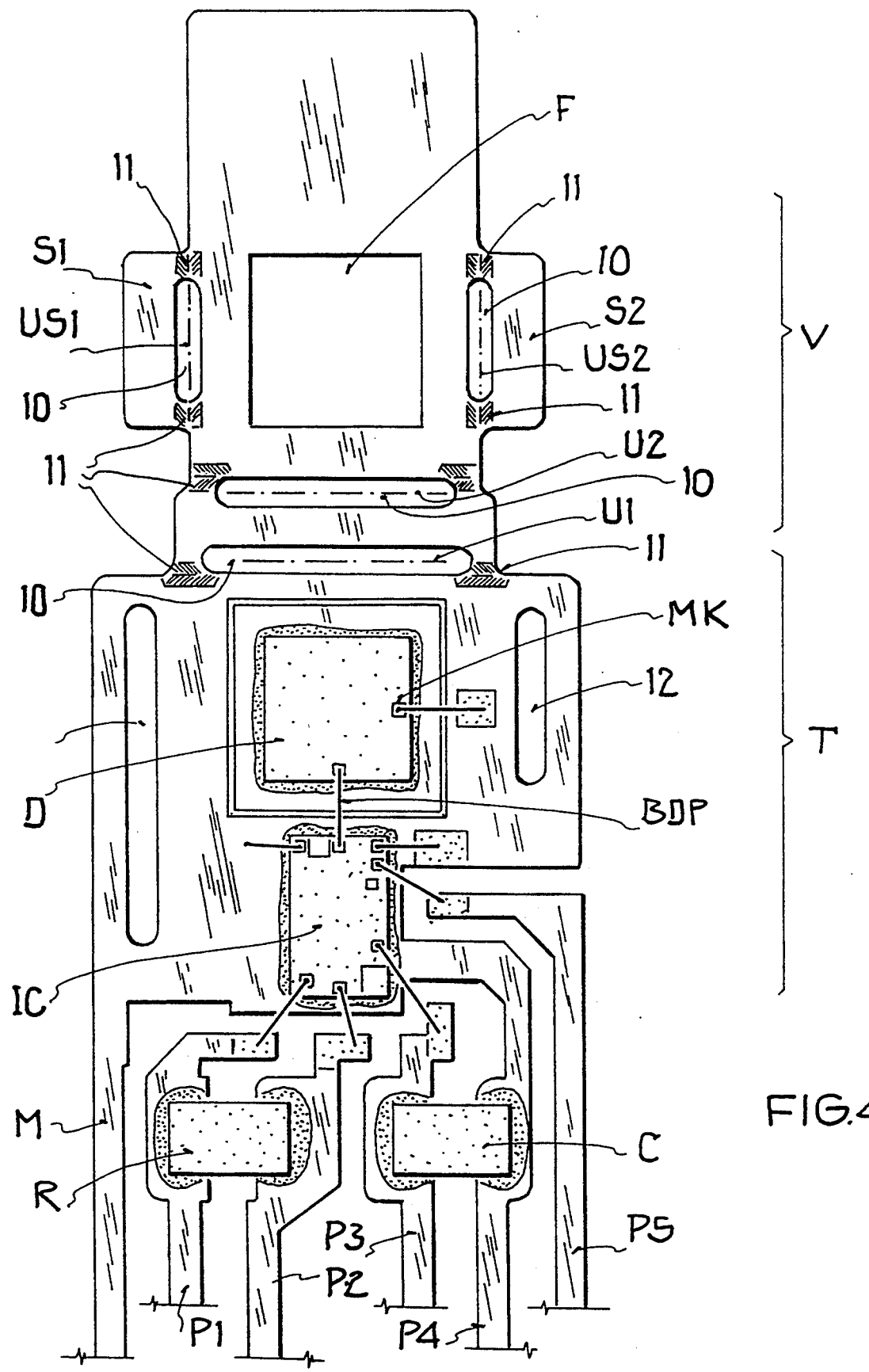
FIG. 4: Detailed plan view of the upper part of the strip configuration circled in FIG. 3.

The embodiment according to FIGS. 3 and 4 differs from that in FIGS. 1 and 2 in particular in that the semiconductor component to be shielded is an infrared detector D, and in that further electrical components are provided, namely an integrated circuit IC, an SMD resistor R and an SMD capacitor C. In the embodiment, the infrared detector D is an Si pin diode. All electrical and mechanical components together form in the cast state (the casting is not shown) a remote control reception module. FIGS. 3 and 4 relate to the production stage as per FIG. 1, in which the extension section V is not yet folded over the carrier section T. The lateral sections S1 and S2 are also not yet folded up. By folding over these parts, a condition is obtained that corresponds to that in FIG. 2, which is however not shown specifically for the remote control reception module. Several strip segments P1–P5 are provided in addition to the ground strip segment M.

For the infrared detector D to be able to receive infrared light when the extension section V is folded over, a window F is provided in the extension section V of which the size and position have been selected such that it leaves open the receiving surface of the detector D when the extension section V is folded over. The extension section V is slightly narrower than the carrier section T, since the semiconductor components D and IC on the carrier section T are narrower than the carrier section T itself. The detector D in particular must be electromagnetically shielded, however the extension section V is selected sufficiently long to also cover the IC completely, but in particular to cover the bond wire BDP (FIG. 4) which connects a contact emitting the detector signal to a contact on the IC. This contact carrying the detector signal comes from the rear face of the detector D, which cannot be clearly discerned from the plan views in FIGS. 3 and 4. This rear face is connected using a non-conducting adhesive to the carrier section T. The detector preferably also has an insulating rear face coating for example an SiO$_2$ passivation layer. The detector diode is affixed to the carrier section T with a polarity such that its highly doped and hence highly conducting side is facing upwards. This side is connected with the aid of a ground contact MK and a wire to the ground strip segment, i.e. to ground, so that the front of the detector D is shielded against electromagnetic radiation. From the side, shielding is provided by the walls of the recess in the carrier section T, by the folded over lateral sections S1 and S2, and by that part of the extension section V between the folding lines U1 and U2.

To achieve reliable folding of all sections for folding over along the required lines, cutouts 10 and stamped areas 11 are provided along all these lines (FIG. 4). These cutouts 10 and stamped areas 11 are made simultaneously with the punching operation of the strip segments. The recess in the carrier section T is also made here, into which the detector D is inserted. Further cutouts 12 are made in the carrier section T to ensure that a secure engagement with the casting compound is achieved. Thermal movements are then transmitted effectively to the carrier section, as a result of which the latter expands or contracts in approximately the same way as the casting compound, thereby leading to a lower stress on bonding points than would be the case if the casting compound and the strip segments were to move independently of one another. Depending on the space available, the cutouts 12 in the carrier section T can be placed such that the lateral sections S1 and S2 on the extension section V can penetrate into these cutouts when folded over, thereby achieving a particularly effective electromagnetic shielding.

Any required casting material can be used for the casting VG in the case of the embodiment in FIGS. 1 and 2, whereas in the case of a configuration as shown in FIGS. B and 4 a material must be used that is permeable in the infrared range from about 800 nm. For this purpose, a colorant, as used for this purpose in cutoff filters, is mixed into an epoxy compound which is in itself transparent. The casting compound is molded such that it has on the side adjacent to the window F a convergent lens guiding infrared light to the reception surface of the detector D. This lens is preferably designed as a cylindrical lens, in order to permit easy removal of the cast semiconductor assemblies from the mold. If a molding process is used alternatively both a cylindrical and a rotation-symmetrical lens can be provided with the same expense.

What is claimed is:

1. A semiconductor assembly comprising:
   a metal frame configuration having at least two strip segments, one of which is a ground strip segment for connection to ground, with said ground strip segment having a carrier section and an extension section;
   at least one semiconductor component attached to an upper part of said ground strip segment on said carrier section of said ground strip segment;
   a casting enclosing the upper part of said strip segment; and wherein
   said extension section of said ground strip segment extends beyond said carrier section and is both folded over in relation to said carrier section and of sufficient length such that it covers said semiconductor component to electromagnetically shield said semiconductor component.

2. A semiconductor assembly according to claim 1, wherein the width of said extension section substantially corresponds to the width of said semiconductor component to be covered.

3. A semiconductor assembly comprising:
   a metal frame configuration having at least two strip segments, one of which is a ground strip segment for connection to ground, with said ground strip segment having a carrier section and an extension section;
   at least one semiconductor component attached to the upper part of said ground strip segment on said carrier section of said ground strip segment;
   a casting enclosing the upper part of said strip segments; and wherein
   said extension section of said ground strip segment extends beyond said carrier section and is folded over relative to said carrier section and is of sufficient length such that it covers said semiconductor component to electromagnetically shield said semiconductor component, and a respective lateral section is provided on each side of said extension, with said lateral sections being folded over towards said carrier section to shield said semiconductor component from the side.

4. A semiconductor assembly according to claim 3, further comprising an end section at the end of said extension section pointing away from said carrier section, said end section being folded over towards said carrier section.

5. A semiconductor assembly according to claim 1, wherein said carrier section has respective recesses in which each of said at least one semiconductor component is disposed.

6. A semiconductor assembly according to claim 1, wherein said ground strip segment has stamped areas to weaken said ground strip segment along at least one fold-over line.

7. A semiconductor assembly according to claim 1, wherein said ground strip segment has cutouts to weaken said ground strip segment along at least one fold-over line.

8. A semiconductor assembly according to claim 1, wherein one of said at least one semiconductor component is a radiation detector and wherein said extension section has a cutout in the area under which the reception surface of said detector is located to allow passage of radiation.

9. A semiconductor assembly according to claim 8, wherein said detector is affixed to said groups strip segment in an electrically insulated fashion, and the upper side semiconductor layer of said detector is highly conductive and is electrically connected to said ground strip segment.

10. A semiconductor assembly according to claim 9, wherein said assembly is a remote control reception module with circuit components mounted on said strip segments, said radiation detector of said module being electromagnetically shielded by said extension section.

11. A semiconductor assembly according to claim 3, wherein the width of said extension section substantially corresponds to the width of said semiconductor component to be covered.

12. A semiconductor assembly according to claim 3, wherein said carrier section has respective recesses in which each of said at least one semiconductor component is disposed.

13. A semiconductor assembly according to claim 3, wherein said ground strip segment has tamped areas to weaken said ground strip segment along at least one fold-over line.

14. A semiconductor assembly according to claim 3, wherein said ground strip segment has cutouts to weaken said ground strip segment along at least one fold-over line.

15. A semiconductor assembly according to claim 3, wherein one of said at least one semiconductor component is a radiation detector and wherein said extension section has a cutout in the area under which the reception surface of said detector is located to allow passage of radiation.

16. A semiconductor assembly according to claim 15, wherein said detector is affixed to said ground strip segment in an electrically insulated fashion, and the upper side semiconductor layer of said detector is highly conductive and is electrically connected to said ground strip segment.

17. A semiconductor assembly according to claim 16, wherein said assembly is a remote control reception module with circuit components mounted on said strip segments, said radiation detector of said module being electromagnetically shielded by said extension section.

* * * * *